US006975972B1

(12) United States Patent
Vreugdenhil et al.

(10) Patent No.: US 6,975,972 B1
(45) Date of Patent: Dec. 13, 2005

(54) DYNAMIC ASSOCIATION OF EQUATIONS TO UNKNOWNS DURING SIMULATIONS OF SYSTEMS DESCRIBED BY HARDWARE DESCRIPTION LANGUAGES

(75) Inventors: Gordon J. Vreugdenhil, Beaverton, OR (US); Ernst Christen, Beaverton, OR (US); Martin Vlach, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 830 days.

(21) Appl. No.: 09/590,796

(22) Filed: Jun. 8, 2000

Related U.S. Application Data

(60) Provisional application No. 60/139,985, filed on Jun. 18, 1999.

(51) Int. Cl.[7] .......................... G06F 17/10; G06F 7/60; G06F 17/50; G06F 9/45

(52) U.S. Cl. ............................ 703/2; 703/13; 703/14; 703/15; 716/5; 716/6

(58) Field of Search ............................... 703/2, 13–15; 716/5, 6

(56) References Cited

U.S. PATENT DOCUMENTS 4,868,770 A * 9/1989 Smith et al. .................. 703/14
4,985,860 A * 1/1991 Vlach .......................... 703/17
5,548,539 A * 8/1996 Vlach et al. ................... 703/6
6,236,956 B1 * 5/2001 Mantooth et al. ............. 703/14
6,266,630 B1 * 7/2001 Garcia-Sabiro et al. ....... 703/14
6,532,569 B1 * 3/2003 Christen et al. ............... 716/2

OTHER PUBLICATIONS

IEEE Standard 1076.1-1999. Mar. 18, 1999.*
Christen, E. et al. "VHDL-AMS—A Hardware Description Language for Analog and Mixed-Signal Applications". IEEE Transactions on Circuits and System II: Analog and Digital Signal Processing. vol. 46, Issue 10, Oct. 1999. pp. 1263-1272.*

(Continued)

*Primary Examiner*—Kevin J. Teska
*Assistant Examiner*—Ayal Sharon
(74) *Attorney, Agent, or Firm*—Silicon Valley Patent Group LLP

(57) ABSTRACT

In simulating a physical circuit or system including analog and mixed signal digital-analog components, a computer models the physical circuit or system as a system of simultaneous equations. Conditional equations with associated conditions that can be true or false at different analog solution iterations result in a system of simultaneous equations that can change during the simulation. Rather than reformulating the system of simultaneous equations at each analog solution iteration, the system of simultaneous equations includes slots that are associated with conditional equations as the conditional equations become active. At a given point during the simulation, the conditions associated with the conditional equations are evaluated to determine which conditional equations are active. The values of the active conditional equations are placed in the slots in the system of simultaneous equations. System variables are associated with active conditional equations. The system of simultaneous equations is then solved to determine the values of the system variables. If there are additional analog solution iterations, the active conditional equations can change, and different conditional equations can be associated with each of the slots in the system of simultaneous equations. Once the simulation is complete, the results of the simulation (i.e., the values of the variables in the simulation model) can be used to analyze the behavior of the physical circuit or system.

23 Claims, 4 Drawing Sheets

OTHER PUBLICATIONS

Christen, E. et al. "VHDL 1076.1—Analog and Mixed-Signal Extensions to VHDL". Proceedings EURO-DAC '96. Sep. 20, 1996. pp. 556-561.*
Damon, D. et al. "Introduction to VHDL-AMS. 1. Structural and Discrete Time Concepts." Proc. 1996 IEEE Int'l Symposium on Computer-Aided Control System Design. Sep. 18, 1996. pp. 264-269.*
Christen, E. et al. "Introduction to VHDL-AMS.2. Continuous and Mixed Continuous/Discrete Concepts." Proc. 1996 IEEE Int'l Symposium on Computer-Aided Control System Design. Sep. 18, 1996. pp. 270-275.*
Shi, R. "VHDL-A: Analog Extension to VHDL". Proc. 7th Annual IEEE In'l ASIC Conf. and Exhibit, 1994. Sep. 23, 1994. pp. 160-165.*
Saleh, et al. "Analog Hardware Description Languages". Proc. of IEEE 1994 Custom Integrated Circuits Conf. May 4, 1994. pp. 349-356.*
Mantooth, H.A. et al. "Beyond Spice with Saber and MAST". 1992 IEEE Int'l Symposium on Circuits and Systems (ISCAS '92). May 13, 1992. vol. 1, pp. 77-80.*
Vlach, M. "Modeling and Simulation with Saber". Proc., 3rd Annual IEEE ASIC Seminar and Exhibit, 1990. Sep. 21, 1990. pp. T/11.1-T/1111.*
Vlach, J. "Computer Oriented Formulation of Equations and Analysis of Switch-Capacitor Networks". IEEE Transactions on Circuits and Systems. vol. 31, Issue 9, Sep. 1994. pp. 753-765.*
Sasaki, Hisashi. "A New Dynamic Equation Scheduling to Extend VHDL-AMS" . Proc. of Asia-Pacific Conf. on Chip Design Languages. (APCHDL '99). Fukuoka, Japan. Oct. 6-8, 1999.*
Frey, Peter et al. "SEAMS: Simulation Environment for VHDL-AMS". Proc. of the 30th Conf. on Winter Simulation. Washington DC., Dec. 13-16, 1998.*
Sasaki, T. et al. "Semantic Analysis of VHDL-AMS by Attribute Grammar". Proc. of Forum on Design Languages (FDL '98). Sep. 6-10, 1998.*
Kazmierski, T. "A Formal Description of VHDL-AMS Analogue Systems". Proc. of Design Automation and Test in Europe (DATE '98). Feb. 23-26, 1998.*
Acuna, E.L. et al. "Simulation Techniques for Mixed Analog/Digital Circuits". IEEE Journal of Solid-State Circuits. vol. 25, Issue 2, Apr. 1990. pp. 353-363.*
Acuna, E.L. et al. "iSPLICE3: A New Simulator for Mixed Analog/Digital Circuits". Proc. of the 1989 IEEE Custom Integrated Circuits Conf. May 15-18, 1989. pp. 13.1/1-13. 1/4.*
El Tahawy, H. et al. "VHDeLDO: A New Mixed Mode Simulation". Proc. 1993 European Design Automation Conf. (1993 EURO-DAC). Sep. 20-24, 1993. pp. 546-551.*
"ADOL-C: A Package for Automatic Differentiation of Algorithms Written in C/C++" http://www-unix.mcs.anl.gov/autodiff/AD_Tools/adolc.anl/adolc.html. Printed Jan. 15, 2004.*
Christen, E. et al., "Introduction to VHDL-AMS: 1. Structural and Discrete Time Concepts", Proc. of 1996 IEEE In'l Symposium on Computer-Aided Control System Design. Sep. 15-18, 1996.*
Christen, E. et al., "Introduction to VHDL-AMS: 2. Continous and Mixed Continuous / Discrete Concepts", Proc. of 1996 IEEE Int'l Symposium on Computer-Aided Control System Design. Sep. 15-18, 1996.*

* cited by examiner

DYNAMIC ASSOCIATION OF EQUATIONS TO UNKNOWNS DURING SIMULATIONS OF SYSTEMS DESCRIBED BY HARDWARE DESCRIPTION LANGUAGES

RELATED APPLICATION DATA

This application claims priority from U.S. Provisional Application No. 60/139,985, filed Jun. 18, 1999.

This application is related to U.S. patent application Ser. No 09/590,862 entitled "Classification of the Variables In a System of Simultaneous Equations Described By Hardware Description Languages,"filed Jun. 8, 2000 which is incorporated herein by reference and which has issued on Mar. 11, 2003 as U.S. Patent 6,532,569.

This invention was made with government support under cooperative agreement F30602-96-2-0309 awarded by the Air Force. The Government has certain rights in the invention.

FIELD OF THE INVENTION

The present invention relates to the field of computer simulation of analog and mixed signal digital-analog physical circuits and systems, and more particularly to solving systems of simultaneous equations including dynamically changing equations.

BACKGROUND OF THE INVENTION

Simulation methods and apparatus are useful in increasing design productivity in a wide variety of applications because design defects can be detected prior to construction of the actual apparatus being simulated. Where the physical circuit or system includes an analog or mixed signal analog-digital component, simulation requires solving a system of simultaneous equations. The variables in these equations can be classified into one of several categories, depending on how their solutions are obtained. Input variables are variables whose values are effectively inputs to the system. Output variables are variables whose values are outputs of the system. Intermediate and system variables are variables that comprise the heart of the system, and whose values generally feedback on themselves.

In existing simulation systems, system variables exist in a one-to-one correspondence with some related equation; there is exactly one equation for each system variable slot. The relationship between a system variable and its related equation is determined prior to simulation and does not change during the simulation. Although this relationship is desirable, it is not always achievable. Occasionally one or more of the equations in the system of simultaneous equations are dynamic: i.e., the specific equation changes depending on specific circumstances of the system of simultaneous equations. Standard techniques for solving systems of simultaneous equations break down in the presence of simulation time changes in the relationship between equations and system variables.

Accordingly, a need exists for a technique for solving systems of simultaneous equations including conditional equations.

SUMMARY OF THE INVENTION

The simulator assembles a system of simultaneous equations. Equations that do not change depending on the circumstances are permanently associated with slots and therefore with a system variables. The conditions that apply to the conditional equations are evaluated. The conditional equation is active when the conditions related to the conditional equation evaluate to true. The active conditional equations are then assigned to slots in the system of simultaneous equations, which can then be solved to determine the values of the system variables. If additional evaluations of the system of equations are required, the active conditional equations can be cleared from the slots, and a new set of active conditional equations selected.

The foregoing and other objects, features and advantages of the invention will become more readily apparent from the following detailed description of a preferred embodiment, which proceeds with reference to the drawings.

DETAILED DESCRIPTION OF THE PREFERRED EMBODIMENT

Figure 1:
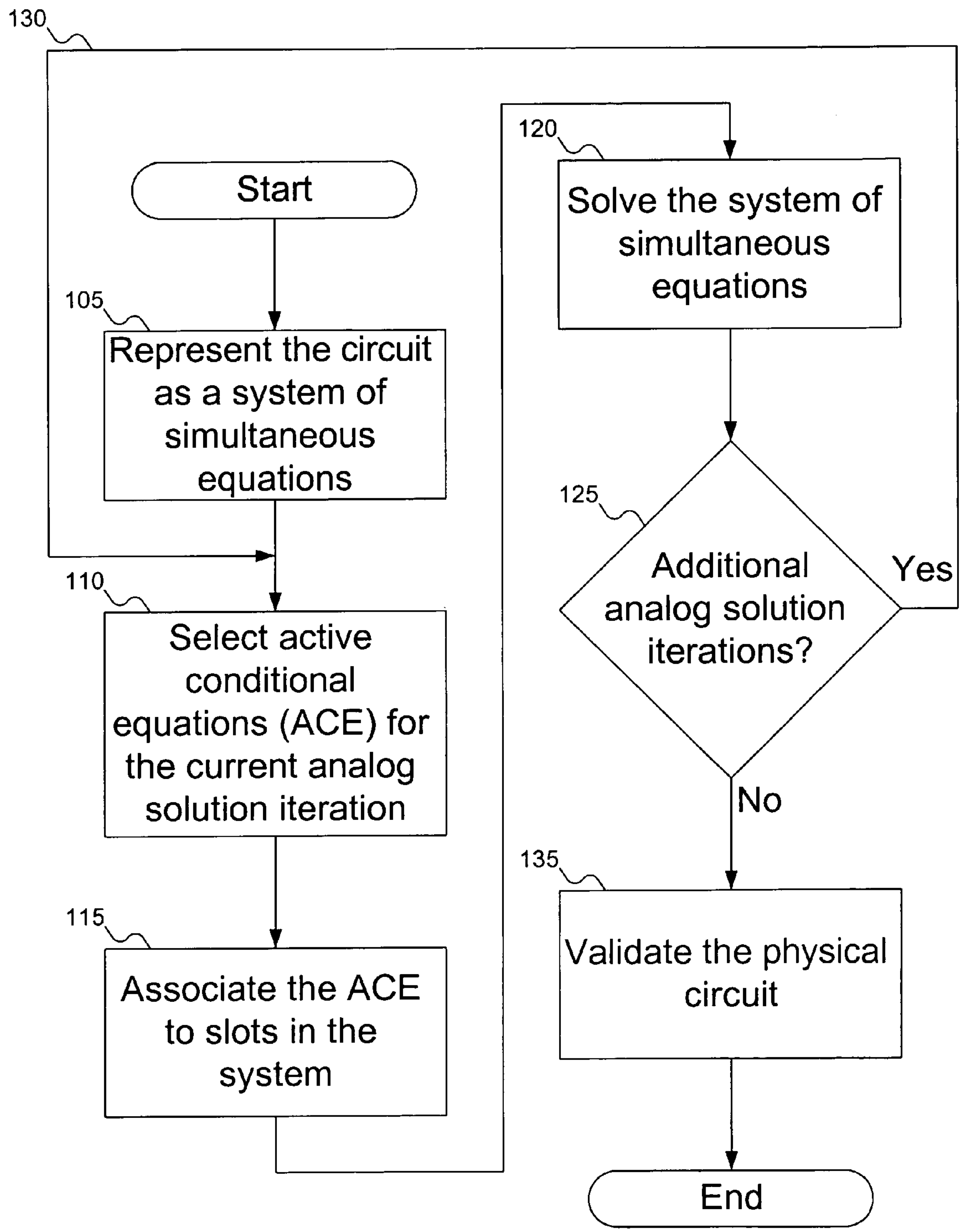
FIG. 1 is a flowchart of a method according to the invention for solving a system of simultaneous equations representing a physical circuit or system including a conditional equation.

Software systems that perform hardware simulation can do so using analog and discrete descriptions of the hardware behavior. Analog descriptions of the behavior are described as a set of simultaneous equations that need to be solved by a simultaneous equation solution algorithm in order to determine how the simulated system will behave. The simultaneous equations are expressed in terms of a certain number of unknowns and to find a solution there must be exactly one equation for each of the unknowns. The term 'system variable' describes the set of unknowns within the set of equations. Simulation systems may decrease the size of the system of equations and the number of system variables by using techniques such as those described in the above-identified U.S. Pat. No. 6,532,569 entitled "Classification of the Variables in a System of Simultaneous Equations Described By Hardware Description Languages."

In analog designs, it is advantageous to be able to have equations that change during simulation in order to describe regions of operation for some device, a shown by a simple, illustrative example. Table 1 describes the behavior of a MOS transistor using conditions that describe the three regions of operation for the transistor. The example assumes:

1) there are electrical connections "drain," "source," and "gate";
2) vgs is the voltage from gate to source;
3) vds is the voltage from drain to source;
4) ids is the current through drain to source;
5) gm is the transconductance and vth is the voltage threshold of the transistor.

TABLE 1

| | |
|---|---|
| if vgs − vth <= 0.0 | |
| “ids == 0.0” | is the active equation |
| else if vgs − vth <= vds | |
| “ids == 0.5 * gm * (vgs − vth) ** 2” | is the active equation |
| else | |
| “ids == gm * ((vgs − vth) − 0.5 * vds) * vds” | is the active equation |
| end | |

This system requires that the equations change during simulation as the model changes between the regions. This invention provides an efficient method for changing between the equations during simulation.

In a system of simultaneous equations, each system variable is said to have a “slot” and there is some set of equations that can be used to fill the slot in order to associate the system variable with an equation for solving the system of equations. The invention is a system and method that permits a simulation-time (i.e., dynamic) association between a set of conditional equations and a set of system variable slots when the number of conditional equations is at least as large as the number of system variable slots. In this approach, the equation that fills the slot is not predetermined prior to simulation. Slots can be filled with different equations at different analog solution iterations during the simulation and an equation can populate different slots at different analog solution iterations during the simulation. (An analog solution iteration is defined to occur when the analog solver requires that values need to be determined for the expressions forming the equations in the system.) This system and method is critical for high performance simulation of systems in which the set of active equations in the simultaneous system can change during the simulation. The language described in IEEE Standard 1076.1, subsequently referred to as VHDL-AMS, is a hardware description language used for analog and digital simulation that permits such changes in the set of equations during simulation time and will be used as the context for describing the invention. The invention is not limited, however, to use in VHDL-AMS.

The dynamic association can be carried out as follows, using VHDL-AMS modeling terminology for illustrative purposes, in a simulator identified as VeriasHDL™.

VHDL-AMS defines the set of “characteristic expressions” that define the set of simultaneous equations the simulator must solve at a given analog solution iteration. (The term characteristic expression is defined in VHDL-AMS, and is subsumed by the more general term “conditional equation,” also used in this document.) VHDL-AMS also defines “simultaneous if” and “simultaneous case” statements that permit the set of characteristic expressions to change between analog solution iterations based on some specified condition. The conditions may involve values that change during simulation, which means that the system of simultaneous equations changes while the simulation is progressing. In order to deal with this problem, VeriasHDL defines a dynamic association of equations to system variables. Conditions can nest; a single equation or block of equations can have multiple conditions controlling when the equation or block of equations become active; some of the conditions can also govern other equations and others not. The basic approach is as follows:

Assume that prior to simulation the system partitions the set of system variables (equation unknowns) into two subsets—unknowns with fixed associations to single equations, and unknowns whose equation is selected dynamically from some set of potential conditional equations. One trivial choice is to have all system variables and equations participate in dynamic associations. In non-trivial cases, the analysis only needs to consider equations guarded by conditions whose values change during the simulation and the subset of system variables that are not associated with any of the unguarded equations, but the selection of the set does not otherwise affect the applicability of dynamic association.

Assume that the partitioning results in a set of system variables $Q_1 \ldots Q_m$ and a set of conditional characteristic expressions $e_1, e_2, \ldots e_n$ existing inside simultaneous if and simultaneous case statements that will participate in the dynamic associations.

For each i from 1 to n, introduce a corresponding temporary variable, $t_i$, related to $e_i$ and an assignment of the characteristic expression $e_i$ to the temporary variable $t_i$. For each j from 1 to m, generate a new unconditional association between the slot for $Q_j$ and a variable $q'_j$ where $q'_j$ is a new temporary variable that is otherwise undefined. Each $q'_j$ is called the dynamic slot target variable for the associated $Q_j$.

During simulation, at a particular analog solution iteration, the active characteristic expressions are determined by evaluating the simultaneous if and case conditions. When a particular expression is determined to be active, say $e_k$, that expression is evaluated and a value is determined for the temporary variable $t_k$. The value of $t_k$ is assigned to some $q'_j$, where j denotes some q' that has not yet been assigned a value in the current analog solution iteration. A straightforward method for making this selection is to start j at 1 and to increment j after each dynamic association. This procedure effectively creates a new association between the slot for $Q_j$ and the characteristic expression ek and is then used for the current analog solution iteration.

Table 2 depicts an example situation in which $e_k$, $e_{k+3}$, and $e_{k+8}$ are active and are respectively associated with $Q_j$, $Q_{j+1}$, $Q_{j+2}$. The symbol “<->” indicates that the given dynamic slot target variable is associated with the slot for the indicated system variable.

TABLE 2

```
 . . .                                 ----- t_k        := e_k
                                      /
 Q_j           <-> q'_j          <-----                    . . . .
 Q_j + 1       <-> q_j + 1       <----------- t_k + 3  := e_k + 3
 Q_j + 2       <-> q_j + 2       <-----                    . . . .
                                      \
 . . .                                 ----- t_k + 8    := e_k + 8
                                                           . . . .
```

At this point, preliminary values for the $q'_j$ have been determined (through the values for the $t_k$). The preliminary values for each $q'_j$ and the fixed system variables can then be substituted into the simultaneous equations to see if the system of simultaneous equations is solved. If the values for the $q'_j$ and the system variables do not solve the system of simultaneous equations, the direction toward a solution is indicated, and the values for the $q'_j$ and the system variables can be perturbed until a solution for the system of simultaneous equations is reached. How the system of simultaneous equations is solved is known in the art, and will not be further described here.

The use of temporaries, $t_l \ldots t_n$ is an implementation convenience. The temporaries $t_l \ldots t_n$ can be replaced by a single temporary or register to move the value computed for a characteristic expression directly into the selected q'.

During the associations, if all q' variables have been assigned a value and an additional characteristic expression $e_k$ becomes active, then an error has occurred in the model since there are then too many equations for the number of unknowns. Similarly, after all active characteristic expressions have been associated, if there are additional q' variables that have not been associated, an error has occurred in the model since there are too many unknowns for the number of equations.

In an alternative embodiment, the evaluated equation indices can be checked to determine if any of the indices had been associated with system variable slots during the previous analog solution iteration. If any active equations were associated previously with system variable slots, associating the active equations with the same system variable slot as in the previous iteration would improve convergence properties of the analog solution algorithms due to having fewer trajectory changes in the system variables. Any new equations can be associated with the remaining unassociated system variables in the straightforward sequential manner.

FIG. 1 shows a flowchart of the method according to the invention for solving a system of simultaneous equations representing a physical circuit or system including a conditional equation. In FIG. 1, at step 105, the physical circuit or system is represented as a system of simultaneous equations. As discussed above, the system of simultaneous equations can be reduced to only those equations associated with system variables. The system of simultaneous equations includes at least one slot for an equation with an associated condition (i.e. a conditional equation). At step 110, the conditions associated with the conditional equations are evaluated, and the active conditional equations (ACE) are determined. At step 115, the active conditional equations are associated with slots in the system of simultaneous equations. This involves assigning the conditional equation to a dynamic slot target variable (DSTV). At step 120, the system of simultaneous equations is solved to determine the values of the system variables. At decision point 125, the method checks to see if there are any additional analog solution iterations needed for the simulation. If there are additional analog solution iterations needed for the simulation, the method returns to step 110, as shown by line 130. Otherwise, at step 135, the values for the system variables are used to validate the physical circuit or system.

Figure 2:
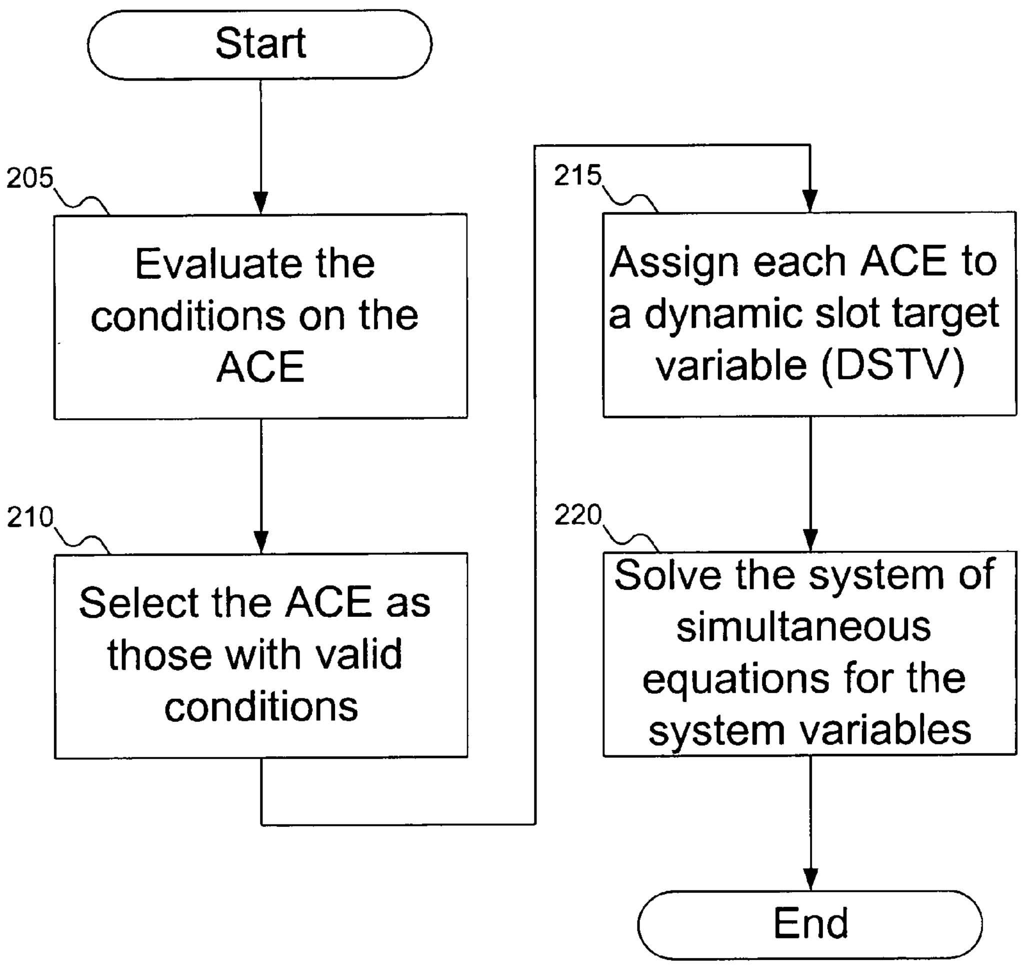
FIG. 2 is a flowchart of a method for selecting active conditional equations in the method of FIG. 1.

FIG. 2 shows a flowchart of a method for selecting active conditional equations in the method of FIG. 1. FIG. 2 shows more detail of steps 110–120 of FIG. 1. At step 205, the conditions that apply to the conditional equations are evaluated to determine which of the conditional equations are active. At step 210, the active conditional equations are selected. At step 215, each conditional equation is associated with the slot for a system variable. Finally, at step 220, solving the system of simultaneous equations determines values for the system variables.

Figure 3:
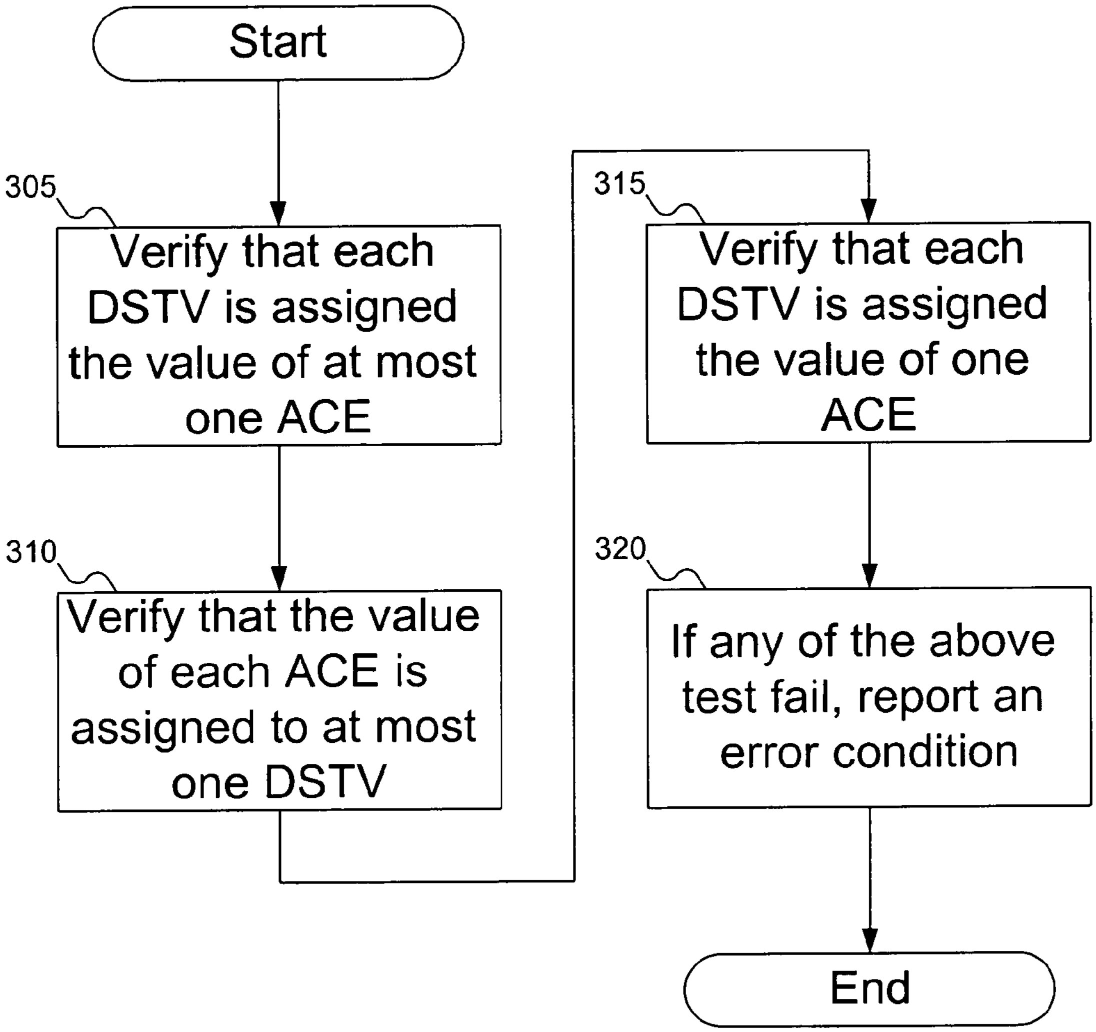
FIG. 3 is a flowchart of a method for verifying that the system of simultaneous equations of FIG. 1 including active conditional equations is solvable.

FIG. 3 shows a flowchart of a method for verifying that the system of simultaneous equations of FIG. 1 including active conditional equations is solvable. At step 305, the system of simultaneous equations is checked to make sure that no dynamic slot target variable is assigned the value of more than one active conditional equation. At step 310, the system of simultaneous equations is checked to make sure that each active conditional equation is assigned to at most one dynamic slot target variable. Finally, at step 315, the system of simultaneous equations is checked to make sure that each dynamic slot target variable is assigned the value of an active conditional equation. If any of the checks 305–315 fail, then at step 320 an error condition is reported.

Figure 4:
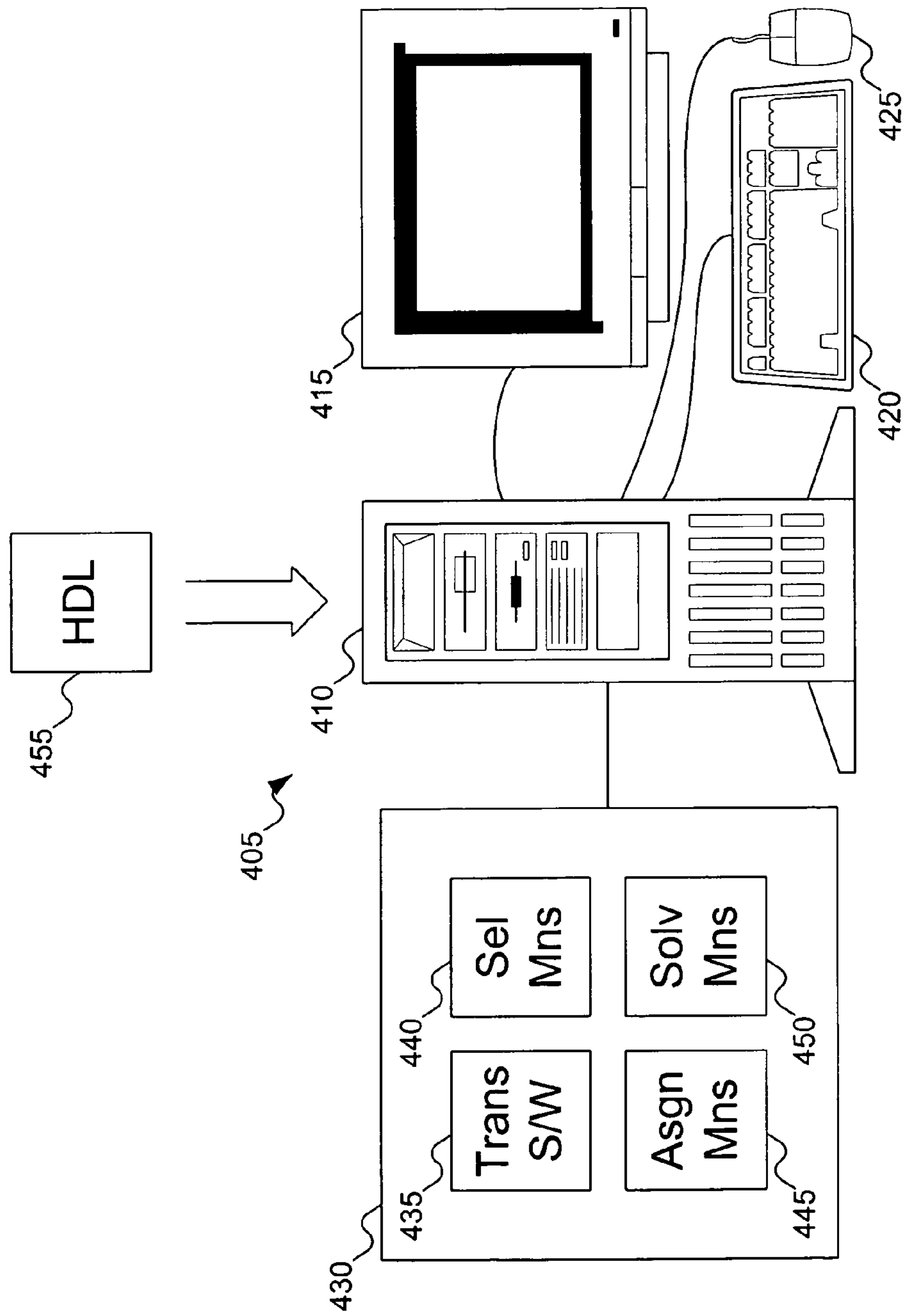
FIG. 4 is a block diagram of a computer system implementing the method and apparatus of this invention.

FIG. 4 shows a computer system implementing the method and apparatus of this invention. In FIG. 4, computer system 405 includes a computer 410, a monitor 415, a keyboard 420, and a mouse 425. Other components may be part of the computer system 405, even though not shown in FIG. 4. For example, computer system 405 can include other input/output devices, such as a plotting device. Similarly, devices such as monitor 415, keyboard 420, and mouse 425 can be missing from the computer system 405, provided that some input and output devices exist. Computer system 405 also includes simulator 430. Simulator 430 performs the simulation of analog and mixed signal digital-analog physical circuits and systems. Simulator 430 includes translation software 435, selection means 440, assignment means 445, and solving means 450. Translation software 435 translates a hardware description language description of a physical circuit or system, such as HDL file 455, into the systems of equations. Selection means 440 is responsible for determining which conditional equations describing the physical circuit or system are active. Assignment means 445 is responsible for assigning the value of an active conditional equations to a dynamic slot target variable in the system of simultaneous equations. Finally, solving means 450 is responsible for solving the system of simultaneous equations to determine values for system variable associated with the active conditional equations.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. In a computer simulation of a physical circuit or system including an analog or mixed signal digital-analog component, the physical circuit or system described in a hardware description language and characterized by a system of simultaneous equations whose unknowns are system variables, the method comprising:

partitioning the system variables into a fixed set and a dynamic set;

wherein each system variable in the fixed set is an unknown with a fixed association to a single equation;

wherein each system variable in the dynamic set has a slot;

wherein each system variable in the dynamic set also has a dynamic slot target variable associated with the slot in the system of simultaneous equations;

selecting an active conditional equation at a current analog solution iteration;

assigning a value for the active conditional equation to a dynamic slot target variable at the current analog solution iteration, thereby associating the active conditional equation with a slot in the system of simultaneous equations;

solving the system of simultaneous equations; and using the solution to the system of simultaneous equations to validate the physical circuit or system;

wherein said representing, said selecting, said assigning, said solving and said using are performed in a computer system.

2. A method of solving a system of simultaneous equations including a plurality of conditional equations, the system of simultaneous equations describing a physical circuit or system in a hardware description language, the circuit including an analog component, the method comprising:

partitioning the system variables into a fixed set and a dynamic set;

wherein each system variable in the fixed set is an unknown with a fixed association to a single equation;
wherein each system variable in the dynamic set has a slot;
wherein each system variable in the dynamic set also has a dynamic slot target variable associated with the slot;
selecting a set of active conditional equations at a current analog solution iteration;
assigning a value for each active conditional equation in the set of active conditional equations to a dynamic slot target variable at the current analog solution iteration, thereby associating the active conditional equation with a slot in the system of simultaneous equations; and
solving the system of simultaneous equations at the current analog solution iteration;
wherein said representing, said selecting, said assigning, and said solving are performed in a computer system.

3. A method according to claim 2, the method further comprising:
said computer checking if a new current analog solution is needed, based on a solution obtained by said solving;
said computer selecting a new set of active conditional equations at a new current analog solution iteration;
wherein the new set is selected based on said solution obtained by said solving;
said computer assigning a value for each active conditional equation in the new set of active conditional equations to a dynamic slot target variable at the new current analog solution iteration, thereby associating the active conditional equation with a slot in the system of simultaneous equations; and
said computer solving the system of simultaneous equations at the new current analog solution iteration.

4. A method according to claim 2, wherein assigning a value for each active conditional equation includes relating a system variable to each active conditional equation for the current analog solution iteration.

5. A method according to claim 4, wherein solving the system of simultaneous equations includes determining a value for each system variable related to an active conditional equation.

6. A method according to claim 2, wherein at most one conditional equation is assigned to each dynamic slot target variable at the current analog solution iteration.

7. A method according to claim 2, wherein each conditional equation is assigned to at most one dynamic slot target variable at the current analog solution iteration.

8. A method according to claim 2, wherein the number of active conditional equations is required to be equal to the number of dynamic slot target variables.

9. A method according to claim 8, the method further comprising said computer reporting a simulation failure if the number of active conditional equations differs from the number of dynamic slot target variables while attempting to solve the system of simultaneous equations.

10. A method according to claim 2, wherein selecting an active conditional equation includes evaluating a condition associated with the active conditional equation.

11. A method according to claim 10, wherein evaluating a condition occurs before selecting the active conditional equation.

12. A computer-readable medium containing a program, that when executed, implements a method for solving a system of simultaneous equations including one or more conditional equations, the system of simultaneous equations describing a physical circuit or system in a hardware description language, the circuit including an analog component, the program comprising:
partitioning software to partition the system variables into a fixed set and a dynamic set;
wherein each system variable in the fixed set is an unknown with a fixed association to a single equation;
wherein each system variable in the dynamic set has a slot;
wherein each system variable in the dynamic set also has a dynamic slot target variable associated with the slot;
selection software to select a set of active conditional equations at a current analog solution iteration;
assignment software to assign a value for each active conditional equation in the set of active conditional equations to a dynamic slot target variable at the current analog solution iteration, thereby associating the active conditional equation with a slot in the system of simultaneous equations; and
solution software to solve the system of simultaneous equations at the current analog solution iteration.

13. A computer-readable medium containing a program according to claim 12, the program further comprising:
checking software to check if a new current analog solution is needed, based on a solution obtained by said solution software;
said selection software to select a new set of active conditional equations at a new current analog solution iteration;
wherein the new set is selected based on said solution obtained by said solution software;
said assignment software to assign a value for each active conditional equation in the new set of active conditional equations to a dynamic slot target variable at the new current analog solution iteration, thereby associating the active conditional equation with a slot in the system of simultaneous equations; and
said solution software to solve the system of simultaneous equations at the new current analog solution iteration.

14. A computer-readable medium containing a program according to claim 12, wherein the assignment software includes relation software to relate a system variable to each active conditional equation for the current analog solution iteration.

15. A computer-readable medium containing a program according to claim 14, wherein the solution software includes determination software to determine a value for each system variable related to an active conditional equation.

16. A computer-readable medium containing a program according to claim 12, wherein at most one conditional equation is assigned to each dynamic slot target variable at the current analog solution iteration.

17. A computer-readable medium containing a program according to claim 12, wherein each conditional equation is assigned to at most one dynamic slot target variable at the current analog solution iteration.

18. A computer-readable medium containing a program according to claim 12, wherein the number of active conditional equations is required to be equal to the number of dynamic slot target variables.

19. A computer-readable medium containing a program according to claim 18, the program further comprising reporting software to report a simulation failure if the number of active conditional equations differs from the number of dynamic slot target variables while attempting to solve the system of simultaneous equations.

20. A computer-readable medium containing a program according to claim 12, wherein the selection software includes evaluation software to evaluate a condition associated with the active conditional equation.

21. A computer-readable medium containing a program according to claim 20, wherein the evaluation software is executed before the selection software.

22. An apparatus for simulating a circuit, solving a system of simultaneous equations including a conditional equation, the system of simultaneous equations describing a physical circuit or system in a hardware description language, the circuit including an analog component, the apparatus comprising:

a computer for simulating the physical circuit or system;

a hardware description language description of the physical circuit or system stored on a computer-readable medium;

translation software to translate the hardware description language description into a system of simultaneous equations, the system of simultaneous equations including one or more slots for conditional equations selected from a set of possible conditional equations;

means for selecting a set of active conditional equations;

means for assigning a value for each active conditional equation in the set of active conditional equations to a dynamic slot target variable at the current analog solution iteration, thereby associating the active conditional equation with a slot in the system of simultaneous equations; and means for solving the system of simultaneous equations at the current analog solution.

23. An apparatus according to claim 22, wherein the means for selecting an active conditional equation includes means for testing a condition associated with the active conditional equation.

* * * * *